United States Patent
Huang et al.

(10) Patent No.: US 10,038,412 B2
(45) Date of Patent: Jul. 31, 2018

(54) SIGNAL AMPLIFICATION PROCESSING METHOD AND APPARATUS

(71) Applicant: Huawei Technologies Co., Ltd., Shenzhen (CN)

(72) Inventors: Wei Huang, Chengdu (CN); Xiang Feng, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/645,579

(22) Filed: Jul. 10, 2017

(65) Prior Publication Data

US 2017/0310285 A1    Oct. 26, 2017

Related U.S. Application Data

(63) Continuation of application No. PCT/CN2015/070518, filed on Jan. 12, 2015.

(51) Int. Cl.
*H03F 1/32* (2006.01)
*H03F 3/24* (2006.01)
(Continued)

(52) U.S. Cl.
CPC ............. *H03F 1/3247* (2013.01); *H03F 1/02* (2013.01); *H03F 3/19* (2013.01); *H03F 3/245* (2013.01);
(Continued)

(58) Field of Classification Search
CPC .................................................... H03F 1/3241
(Continued)

(56) References Cited

U.S. PATENT DOCUMENTS 6,765,443 B2    7/2004  Pehike
7,885,682 B2 *  2/2011  Sorrells ................. H03D 7/165
                                                            330/69

(Continued)

FOREIGN PATENT DOCUMENTS

CN    1695297 A    11/2005
CN    1855798 A    11/2006
(Continued)

OTHER PUBLICATIONS

Machine Translation and Abstract of Chinese Publication No. CN101247109, Aug. 20, 2008, 6 pages.
(Continued)

*Primary Examiner* — Henry Choe
(74) *Attorney, Agent, or Firm* — Conley Rose, P.C.

(57) ABSTRACT

The application relates to the field of communications technologies, and disclose a signal amplification processing method and apparatus. The method includes setting multiple groups of parameter values for a signal decomposition parameter group, separately performing signal amplification processing based on each group of parameter values, obtaining a power amplification efficiency corresponding to each group of parameter values, obtaining a group of parameter values corresponding to a maximum power amplification efficiency in the power amplification efficiency corresponding to each group of parameter values, and setting the group of parameter values corresponding to the maximum power amplification efficiency as parameter values of the signal decomposition parameter group. Thus, the power amplification efficiency may be improved.

16 Claims, 4 Drawing Sheets

(51) Int. Cl.
*H03F 1/02* (2006.01)
*H03F 3/19* (2006.01)
*H04B 1/02* (2006.01)

(52) U.S. Cl.
CPC .. *H03F 2200/451* (2013.01); *H03F 2200/462* (2013.01); *H03F 2200/465* (2013.01); *H04B 1/02* (2013.01)

(58) Field of Classification Search
USPC .......................................... 330/149; 375/297
See application file for complete search history.

(56) References Cited

U.S. PATENT DOCUMENTS

| | | | | |
|---|---|---|---|---|
| 7,929,989 | B2* | 4/2011 | Sorrells | H03D 7/165 330/69 |
| 8,626,093 | B2* | 1/2014 | Sorrells | H03F 1/32 455/114.3 |
| 9,166,528 | B2* | 10/2015 | Sorrells | H03F 1/32 |
| 2004/0239416 | A1 | 12/2004 | Smiley et al. | |
| 2006/0239374 | A1 | 10/2006 | Aldana et al. | |
| 2009/0243943 | A1* | 10/2009 | Mumbru | H01Q 1/243 343/702 |
| 2013/0113554 | A1 | 5/2013 | Bai et al. | |

FOREIGN PATENT DOCUMENTS

| | | |
|---|---|---|
| CN | 101247109 A | 8/2008 |
| EP | 2475094 A1 | 7/2012 |
| WO | 2004077662 A1 | 9/2004 |

OTHER PUBLICATIONS

Foreign Communication From A Counterpart Application, PCT Application No. PCT/CN2015/070518, English Translation of International Search Report dated Sep. 25, 2015, 2 pages.

Foreign Communication From A Counterpart Application, PCT Application No. PCT/CN2015/070518, English Translation of Written Opinion dated Sep. 25, 2015, 5 pages.

Foreign Communication From A Counterpart Application, European Application No. 15877403.4, Extended European Search Report dated Oct. 27, 2017, 6 pages.

\* cited by examiner

SIGNAL AMPLIFICATION PROCESSING METHOD AND APPARATUS

CROSS-REFERENCE TO RELATED APPLICATIONS

This application is a continuation of International Application No. PCT/CN2015/070518, filed on Jan. 12, 2015, the disclosure of which is hereby incorporated by reference in its entirety.

TECHNICAL FIELD

The present disclosure relates to the field of communications technologies, and in particular, to a signal amplification processing method and apparatus.

BACKGROUND

A power amplifier is an important radio-frequency device, and is widely applied to devices such as base stations and terminals. Generally, power amplifiers in base stations are mainly multiple-input power amplifiers, such as dual-input power amplifiers and three-input power amplifiers.

Because a power amplifier has multiple input ends, an input signal needs to be decomposed. Generally, a signal decomposer is disposed in a transmitter, and is configured to decompose an input signal. Signal decomposition parameters are set in the signal decomposer. Generally, there are multiple signal decomposition parameters. An output end of the signal decomposer is connected to an input end of the power amplifier. There are multiple manners to decompose the input signal. For example, if a signal of 30 dBm is output, using a dual-input power amplifier as an example, the signal may be obtained by using a radio-frequency signal of 17 dBm and a power amplification voltage of 18 V, or may be obtained by using a radio-frequency signal of 21 dBm and a power amplification voltage of 7 V, or the like. In order to ensure a maximum power amplification efficiency of the power amplifier, parameter values of the signal decomposition parameters when the power amplification efficiency is the maximum may be determined in the foregoing multiple combinations, and are fixedly configured as a group of parameter values corresponding to the maximum power amplification efficiency.

Some approaches have at least the following problems.

Because parameter values of signal decomposition parameters of a signal decomposer are fixed, for example, in various types of communications systems using a networking manner of heterogeneous networks, a field effect transistor and the like in a power amplifier of a base station are often affected by an external environment (for example, a temperature), a power amplification efficiency of a transmitter obtained by using the fixed parameter values is no longer the maximum. Consequently, the power amplification efficiency is relatively low.

SUMMARY

To resolve problems in the some approaches, embodiments of the present disclosure provide a signal amplification processing method and apparatus. The technical solutions are as follows.

According to a first aspect, a signal amplification processing apparatus is provided, where the apparatus includes a first obtaining module configured to set multiple groups of parameter values for a signal decomposition parameter group, separately perform signal amplification processing based on each group of parameter values, and obtain a power amplification efficiency corresponding to each group of parameter values; a second obtaining module configured to obtain a group of parameter values corresponding to a maximum power amplification efficiency in the power amplification efficiency corresponding to each group of parameter values; and a setting module configured to set the group of parameter values corresponding to the maximum power amplification efficiency as parameter values of the signal decomposition parameter group.

With reference to the first aspect, in a first possible implementation manner of the first aspect, the first obtaining module is further configured to: perform signal amplification processing based on a group of initial parameter values specified for the signal decomposition parameter group, sample multiple input signals having different powers, obtain decomposition signals corresponding to each of the input signals, obtain multiple signal groups including the input signals and corresponding decomposition signals, and obtain a power amplification efficiency corresponding to the group of initial parameter values; adjust, according to a pattern search algorithm, decomposition signals in at least one of the obtained multiple signal groups, and for each adjustment, determine a group of parameter values of the signal decomposition parameter group according to multiple signal groups after the adjustment; and separately perform signal amplification processing based on each determined group of parameter values, and obtain a power amplification efficiency corresponding to each group of parameter values.

With reference to the first possible implementation manner of the first aspect, in a second possible implementation manner of the first aspect, the first obtaining module is configured to: in the process of performing signal amplification processing based on a group of initial parameter values specified for the signal decomposition parameter group, obtain instant power amplification efficiencies corresponding to the sampled input signals; and the first obtaining module is configured to: separately perform signal amplification processing based on each determined group of parameter values, and in the process of performing signal amplification processing based on each group of parameter values, separately obtain instant power amplification efficiencies corresponding to the sampled input signals.

With reference to the first possible implementation manner of the first aspect, in a third possible implementation manner of the first aspect, the first obtaining module is configured to: in the process of performing signal amplification processing based on a group of initial parameter values specified for the signal decomposition parameter group, obtain an average power amplification efficiency in a time period used in the signal amplification processing process; and the first obtaining module is configured to: separately perform signal amplification processing based on each determined group of parameter values, and in the process of performing signal amplification processing based on each group of parameter values, separately obtain an average power amplification efficiency in a time period used in the signal amplification processing process.

With reference to the first aspect, in a fourth possible implementation manner of the first aspect, the first obtaining module is configured to: obtain a power amplification current and an output power of the signal amplification processing that is performed based on each group of parameter values, and determine a corresponding power amplification efficiency according to the power amplification current, the output power, and a preset power amplification voltage.

According to a second aspect, a signal amplification processing method is provided, where the method includes setting multiple groups of parameter values for a signal decomposition parameter group, separately performing signal amplification processing based on each group of parameter values, and obtaining a power amplification efficiency corresponding to each group of parameter values; obtaining a group of parameter values corresponding to a maximum power amplification efficiency in the power amplification efficiency corresponding to each group of parameter values; and setting the group of parameter values corresponding to the maximum power amplification efficiency as parameter values of the signal decomposition parameter group.

With reference to the second aspect, in a first possible implementation manner of the second aspect, the setting multiple groups of parameter values for a signal decomposition parameter group, separately performing signal amplification processing based on each group of parameter values, and obtaining a power amplification efficiency corresponding to each group of parameter values includes performing signal amplification processing based on a group of initial parameter values specified for the signal decomposition parameter group, sampling multiple input signals having different powers, obtaining decomposition signals corresponding to each of the input signals, obtaining multiple signal groups including the input signals and corresponding decomposition signals, and obtaining a power amplification efficiency corresponding to the group of initial parameter values; adjusting, according to a pattern search algorithm, decomposition signals in at least one of the obtained multiple signal groups, and for each adjustment, determining a group of parameter values of the signal decomposition parameter group according to multiple signal groups after the adjustment; and separately performing signal amplification processing based on each determined group of parameter values, and obtaining a power amplification efficiency corresponding to each group of parameter values.

With reference to the first possible implementation manner of the second aspect, in a second possible implementation manner of the second aspect, the obtaining a power amplification efficiency corresponding to the group of initial parameter values includes in the process of performing signal amplification processing based on a group of initial parameter values specified for the signal decomposition parameter group, obtaining instant power amplification efficiencies corresponding to the sampled input signals; and the separately performing signal amplification processing based on each determined group of parameter values, and obtaining a power amplification efficiency corresponding to each group of parameter values includes separately performing signal amplification processing based on each determined group of parameter values, and in the process of performing signal amplification processing based on each group of parameter values, separately obtaining instant power amplification efficiencies corresponding to the sampled input signals.

With reference to the first possible implementation manner of the second aspect, in a third possible implementation manner of the second aspect, the obtaining a power amplification efficiency corresponding to the group of initial parameter values includes in the process of performing signal amplification processing based on a group of initial parameter values specified for the signal decomposition parameter group, obtaining an average power amplification efficiency in a time period used in the signal amplification processing process; and the separately performing signal amplification processing based on each determined group of parameter values, and obtaining a power amplification efficiency corresponding to each group of parameter values includes separately performing signal amplification processing based on each determined group of parameter values, and in the process of performing signal amplification processing based on each group of parameter values, separately obtaining an average power amplification efficiency in a time period used in the signal amplification processing process.

With reference to the second aspect, in a fourth possible implementation manner of the second aspect, the obtaining a power amplification efficiency corresponding to each group of parameter values includes obtaining a power amplification current and an output power of the signal amplification processing that is performed based on each group of parameter values, and determining a corresponding power amplification efficiency according to the power amplification current, the output power, and a preset power amplification voltage.

According to a third aspect, a base station is provided, where the base station includes a processor and a memory, where the processor is configured to set multiple groups of parameter values for a signal decomposition parameter group, separately perform signal amplification processing based on each group of parameter values, and obtain a power amplification efficiency corresponding to each group of parameter values; the processor is further configured to obtain a group of parameter values corresponding to a maximum power amplification efficiency in the power amplification efficiency corresponding to each group of parameter values, and store the group of parameter values in the memory; and the processor is further configured to set the group of parameter values corresponding to the maximum power amplification efficiency as the signal decomposition parameter group.

The technical solutions provided in the embodiments of the present disclosure bring the following advantageous effects.

In the embodiments of the present disclosure, multiple groups of parameter values are set corresponding to a signal decomposition parameter group, signal amplification processing is separately performed based on each group of parameter values, and a power amplification efficiency corresponding to each group of parameter values is obtained. A group of parameter values corresponding to a maximum power amplification efficiency is obtained according to the power amplification efficiency corresponding to each group of parameter values. The signal decomposition parameters are set to the obtained parameter values. The group of parameter values corresponding to the maximum power amplification efficiency in the multiple groups of parameter values is set as parameter values of a signal decomposition parameter group, so that a power amplification efficiency of a transmitter of a base station in a communications system is maintained at a maximum value. Even if a power amplifier of the base station is affected by an external environment, the power amplification efficiency of the transmitter may be adjusted to an optimal state in the foregoing manner, so as to improve the power amplification efficiency.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the present disclosure clearer, the following further describes the implementation manners of the present disclosure in detail with reference to the accompanying drawings.

Embodiment 1

Figure 1:
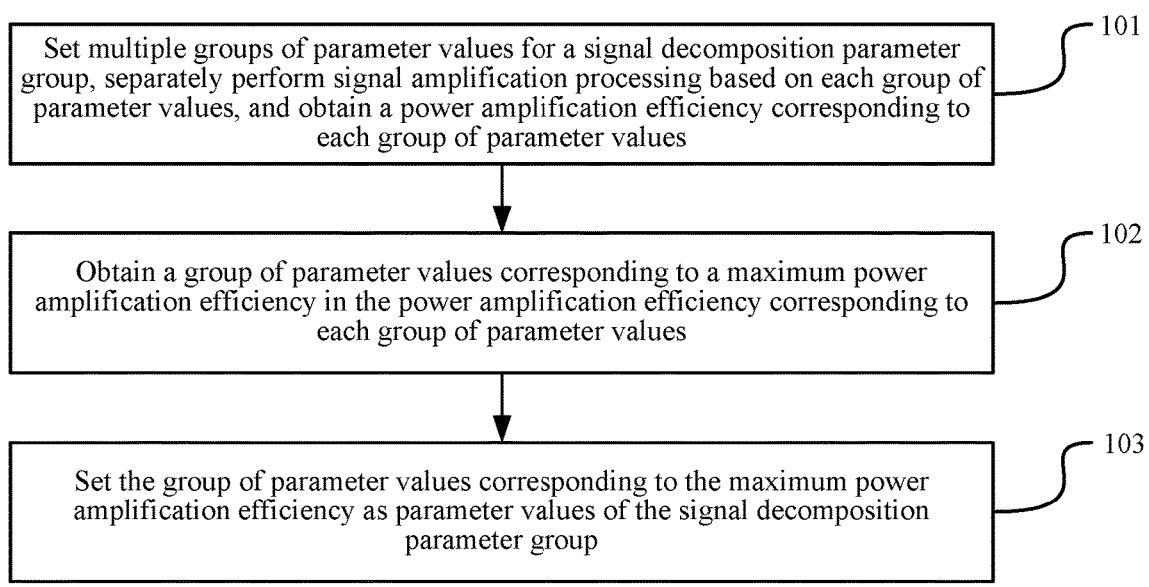
FIG. 1 is a flowchart of a signal amplification processing method according to an embodiment of the present disclosure.

This embodiment of the present disclosure provides a signal amplification processing method. As shown in FIG. 1, the technical solution provided in this embodiment of the present disclosure is applicable to various types of communications systems using a networking manner of heterogeneous networks, for example, a Wideband Code Division Multiple Access (WCDMA) system, a Time Division-Synchronous Code Division Multiple Access (TD-SCDMA) system, a Long Term Evolution (LTE) system, and an LTE-Advanced communications system. The signal amplification processing method may be performed by a transmitter of a base station in the communications system. The base station involved in this embodiment of the present disclosure may be a NodeB (Node-B) in a WCDMA or a TD-SCDMA system, may be an evolved NodeB (e-NodeB) in an LTE system, or may be a device, similar to a base station, in an LTE-Advanced communications system. The transmitter involved in this embodiment of the present disclosure may be any transmitter that includes a signal amplifier and has a signal emission function.

A processing procedure of the method may include the following steps.

Step 101: A transmitter sets multiple groups of parameter values for a signal decomposition parameter group, separately performs signal amplification processing based on each group of parameter values, and obtains a power amplification efficiency corresponding to each group of parameter values.

Step 102: The transmitter obtains a group of parameter values corresponding to a maximum power amplification efficiency in the power amplification efficiency corresponding to each group of parameter values.

Step 103: The transmitter sets the group of parameter values corresponding to the maximum power amplification efficiency as parameter values of the signal decomposition parameter group.

In this embodiment of the present disclosure, a transmitter sets multiple groups of parameter values for a signal decomposition parameter group, separately performs signal amplification processing based on each group of parameter values, and obtains a power amplification efficiency corresponding to each group of parameter values. The transmitter obtains a group of parameter values corresponding to a maximum power amplification efficiency in the power amplification efficiency corresponding to each group of parameter values, and sets the group of parameter values corresponding to the maximum power amplification efficiency as parameter values of the signal decomposition parameter group. The group of parameter values corresponding to the maximum power amplification efficiency in the multiple groups of parameter values is set as parameter values of the signal decomposition parameter group, so that the power amplification efficiency of the transmitter of a base station in a communications system is maintained at a maximum value. Even if a power amplifier of the base station is affected by an external environment, the power amplification efficiency of the transmitter may be adjusted to an optimal state in the foregoing manner, so as to improve the power amplification efficiency.

Embodiment 2

The following describes the processing procedure shown in FIG. 1 in detail with reference to a specific implementation manner. The content may be as follows.

Step 101: A transmitter sets multiple groups of parameter values for a signal decomposition parameter group, separately performs signal amplification processing based on each group of parameter values, and obtains a power amplification efficiency corresponding to each group of parameter values.

Figure 2:
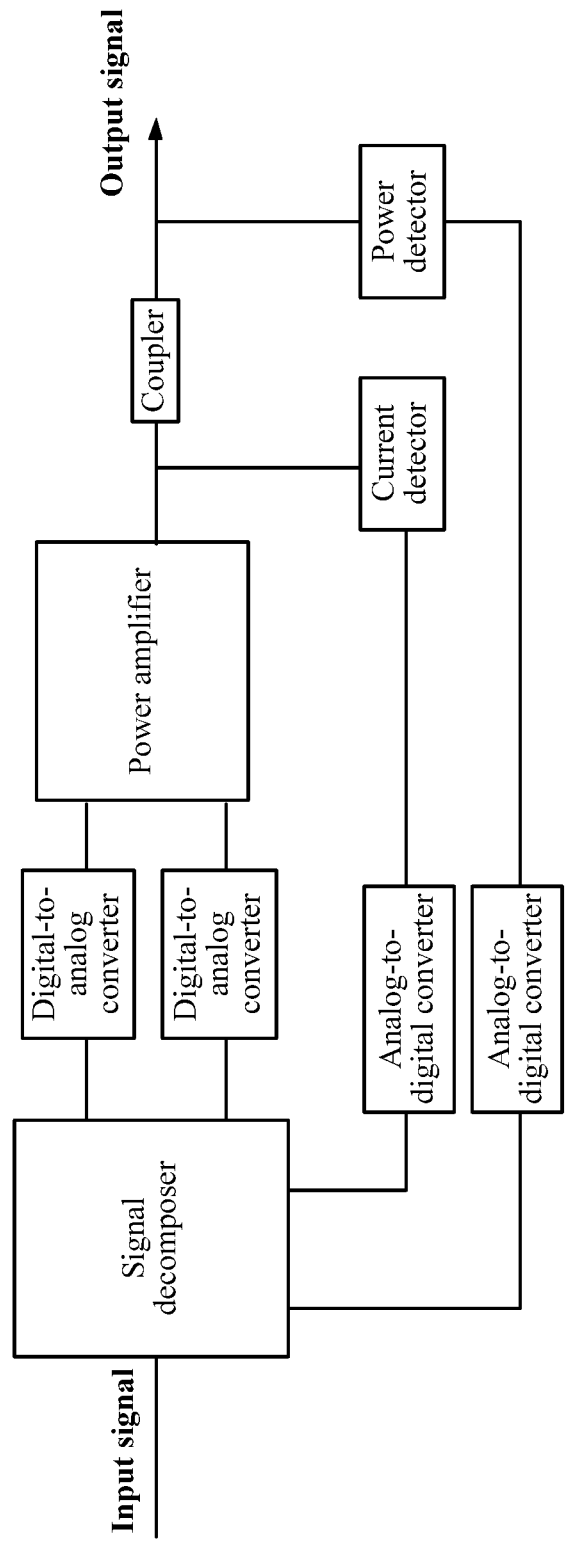
FIG. 2 is a schematic diagram of a circuit connection of a transmitter according to an embodiment of the present disclosure.

During implementation, as shown in FIG. 2, the transmitter includes a power amplifier that is configured to amplify a power of a signal. There may be multiple types of power amplifiers, for example, a single-input power amplifier and a multiple-input power amplifier (that is, an input end of the power amplifier is provided with multiple signal input ports). Because the multiple-input power amplifier has an obvious advantage in performance compared with the single-input power amplifier, the power amplifier in the transmitter may generally be a multiple-input power amplifier, such as a dual-input power amplifier. For the multiple-input power amplifier, because the multiple-input power amplifier has multiple input ports, a signal decomposer may be used to decompose an input signal into multiple decomposition signals. A process of decomposing an input signal by the signal decomposer is generally performed by using a preset decomposition algorithm. In the decomposition algorithm, multiple signal decomposition parameters (which may be referred to as a signal decomposition parameter group) are set, for example, five signal decomposition parameters a, b, c, d, and e, and the five signal decomposition parameters may form a signal decomposition parameter group. The decomposition algorithm may be adjusted by setting different parameter values for the signal decomposition parameter group, so that multiple different decomposition signals are decomposed from the input signal. Then, each of the decomposition signals may be input from an input port to the multiple-input power amplifier, for signal amplification processing.

Figure 3:
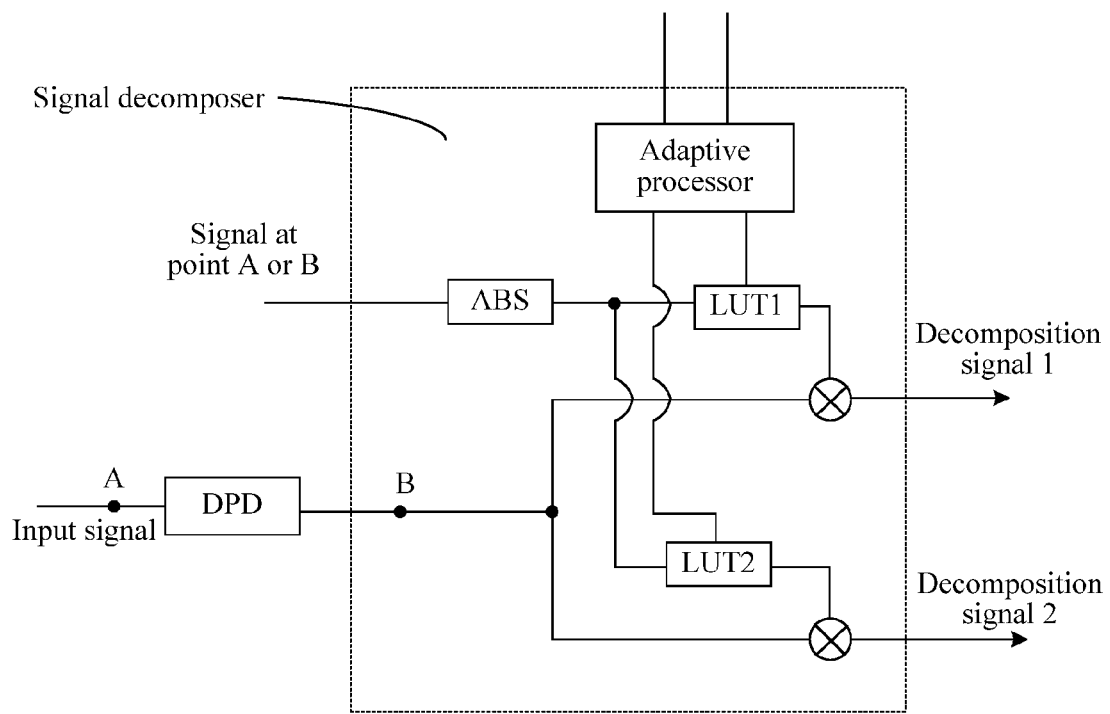
FIG. 3 is a schematic structural diagram of a signal decomposer according to an embodiment of the present disclosure.

A conceptual diagram of the signal decomposer may be shown in FIG. 3. LUT1 and LUT2 may be two lookup tables, and the lookup tables may be set by a user. An input of a lookup table is generally an envelope of an input signal, and different lookup table content corresponds to different decomposition signals. It may be assumed that $g1=LUT1(x)$ and $g2=LUT2(x)$, where x is an input signal, and a differential mode function $y(x)=\operatorname{sqrt}(g1(x)/g2(x))$ may be defined.

Because the differential mode function includes an amplitude-phase relationship between two input signals, the differential mode function is directly related to the power amplification efficiency. It may be considered that an algorithm corresponding to the differential mode function is the signal decomposition algorithm of the signal decomposer. In this way, the differential mode function may include multiple signal decomposition parameters.

The transmitter may use a multiple-input power amplifier to perform signal amplification processing on the input signal. A modulated signal may be used as the input signal, and is transmitted to the signal decomposer. A user or a technician may preset multiple groups of parameter values for the signal decomposition parameter group, and may separately set different parameter values for the signal decomposer. After the input signal is input to the signal decomposer, different decomposition signals may be output by using the parameter values in the signal decomposer, and each of the decomposition signals may be transmitted to the power amplifier. Processed signals are output after corresponding power amplification processing is performed. After the signals are coupled by a coupler, an output power may be calculated or measured. In this case, a power amplification efficiency corresponding to each group of parameter values may be calculated or measured.

Optionally, there are multiple processing manners to obtain the power amplification efficiency corresponding to each group of parameter values. The following provides an optional processing manner, which may include the following content: obtaining a power amplification current and an output power of the signal amplification processing that is performed based on each group of parameter values, and determining a corresponding power amplification efficiency according to the power amplification current, the output power, and a preset power amplification voltage.

During implementation, after the transmitter obtains the output signal on which the signal amplification processing has been performed, an output power of the output signal and a current amplification current in the multiple-input power amplifier may be measured. A power amplification voltage of the multiple-input power amplifier is generally a fixed value, such as 28 V or 50 V. In this way, a direct current power of the multiple-input power amplifier may be calculated by using a product of the power amplification current and the power amplification voltage. Then, the output power may be divided by the calculated direct current power of multiple-input power amplifier to obtain the power amplification efficiency corresponding to each group of parameter values.

Optionally, the processing manner of 101 may be varied. The following provides an optional processing manner, which may include the following steps.

Step 1: Perform signal amplification processing based on a group of initial parameter values specified for the signal decomposition parameter group, sample multiple input signals having different powers, obtain decomposition signals corresponding to each of the input signals, obtain multiple signal groups including the input signals and corresponding decomposition signals, and obtain a power amplification efficiency corresponding to the group of initial parameter values.

During implementation, a group of initial parameter values may be set for the signal decomposition parameter group, and the group of initial parameter values may be set in the signal decomposer. Generally, a power of an input signal of the signal decomposer is within a particular power range, for example, 0 dBFS to −30 dBFS, and a corresponding power amplification power ranges from 0 dBm to 30 dBm. After the input signal is input to the signal decomposer, the input signal may be decomposed by the signal decomposer. Meanwhile, the signal decomposer may sample the input signal to obtain multiple input signals having different powers, such as input signals of 0 dBFS, −5 dBFS, −10 dBFS, −15 dBFS, −20 dBFS, −25 dBFS, and −30 dBFS, where a quantity of input signals having different powers that are obtained by sampling is greater than or equal to a quantity of signal decomposition parameters included in the signal decomposition parameter group. Then, the transmitter may separately obtain decomposition signals corresponding to each of the input signals, and may use any one of the input signals obtained by sampling and decomposition signals corresponding to the input signal to form a signal group. For example, the power amplifier in the transmitter is an envelope tracking power amplifier, a power of a power amplification output signal is 30 dBm, and a corresponding digital domain power is 0 dBFS; in this case, the decomposition signals may include a digital signal corresponding to a radio-frequency signal of 17 dBm and a control signal of a power amplification voltage of 18 V. Therefore, an obtained signal group may be expressed as a digital signal group corresponding to [30 dBm, (17 dBm, 18 V)]. After the input signal is processed by the signal decomposer, the transmitter may separately input, through a corresponding input port of the power amplifier, each of the decomposition signals to the power amplifier for power amplification, and obtain an output signal after the decomposition signals are coupled by the coupler. In this case, an output power of the output signal may be measured, and a power amplification current of the power amplifier may be measured. The transmitter may calculate a direct current power of the power amplifier by using the power amplification current and the preset power amplification voltage, and may divide the output power by the calculated direct current power of the power amplifier, to further obtain a power amplification efficiency, where the power amplification efficiency may be used as a corresponding power amplification efficiency of the group of parameter values.

Optionally, the processing process of obtaining a power amplification efficiency corresponding to the group of initial parameter values may be varied. The following provides two optional processing manners, including the following contents.

Manner 1: In the process of performing signal amplification processing based on a group of initial parameter values specified for the signal decomposition parameter group, obtain instant power amplification efficiencies corresponding to the sampled input signals.

During implementation, an instant power amplification efficiency corresponding to each of the input signals may be obtained. The signal decomposition parameter group used by the signal decomposer in the transmitter may have a group of initial parameter values. The transmitter may perform digital predistortion (DPD) calibration or predistortion processing on the input signal by using a corresponding processor, and then perform signal amplification processing. The output signal in the foregoing manner is the same as the input signal on which the DPD calibration or predistortion processing has not been performed. In this case, one or more instant power amplification efficiencies corresponding to one or more input signals may be measured, and an instant power amplification current of the power amplifier may be measured; further, the instant power amplification efficiency corresponding to each of the input signals is obtained by using the preset power amplification voltage.

Manner 2: In the process of performing signal amplification processing based on a group of initial parameter values specified for the signal decomposition parameter group obtain an average power amplification efficiency in a time period used in the signal amplification processing process.

During implementation, to simplify the processing procedure of obtaining a power amplification efficiency corresponding to a group of parameter values, an average power amplification efficiency in a time period used in the signal amplification processing process may also be obtained. A technician may set a group of initial parameter values for the signal decomposition parameter group used by the signal decomposer in the transmitter. The transmitter may decompose the input signal by using the signal decomposer that is provided with the initial parameter values, to further perform signal amplification processing on the decomposition signals. Then, an average power amplification current and an average output power of the power amplifier in the time period used in the signal amplification processing process are measured, so as to calculate an average power amplification efficiency of each group of parameter values in the time period used in the signal amplification processing process.

Step 2: Adjust, according to a pattern search algorithm, decomposition signals in at least one of the obtained signal groups, and for each adjustment, determine a group of parameter values of the signal decomposition parameter group according to multiple signal groups after the adjustment.

During implementation, after the transmitter obtains multiple signal groups, the multiple signal groups may be adjusted by using a pattern search algorithm or the like. Using the differential mode function as an example, it is assumed that the signal groups are (x0, y0), (x1, y1), and (x2, y2) respectively, where x0, x1, and x2 represent input signals of different powers, and y0, y1, and y2 represent decomposition signals. The signal groups are adjusted by using the pattern search algorithm, and signal groups obtained after the adjustment may be (x0, y0+d), (x1, y1), and (x2, y2); (x0, y0−d), (x1, y1), and (x2, y2); (x0, y0), (x1, y1+d), and (x2, y2); (x0, y0), (x1, y1−d), and (x2, y2); (x0, y0), (x1, y1), and (x2, y2+d); (x0, y0), (x1, y1), and (x2, y2−d); and the like, where d may be a step when the decomposition signals are adjusted, and a value of d may be set by a user. In this way, after the multiple signal groups are adjusted by using the pattern search algorithm, multiple signal groups after the adjustment, such as (x0, y0+d), (x1, y1), and (x2, y2), may be obtained. By using the multiple signal groups and an algorithm corresponding to the differential mode function, an equation set including multiple equations is obtained, and by solving the equations set, a group of parameter values may be obtained. Therefore, the example includes six times of adjustment, and one group of parameter values may be obtained through calculation by using signal groups obtained after each adjustment. In this way, six groups of parameter values can be obtained.

Step 3: Separately perform signal amplification processing based on each determined group of parameter values, and obtain a power amplification efficiency corresponding to each group of parameter values.

During implementation, the multiple groups of parameter values obtained in step 2 may be sequentially set in the signal decomposer. The transmitter may transmit the input signals to the signal decomposer for signal decomposition, and then the decomposition signals are input to the power amplifier for power amplification. After the amplified decomposition signals are coupled by the coupler, the power amplification efficiency corresponding to each group of parameter values may be calculated by using the foregoing method for calculating a power amplification efficiency. Refer to the related content above for a specific processing manner, and details are not described herein again.

Optionally, for the case of manner 1, a processing manner of step 3 may include the following content: separately performing signal amplification processing based on each determined group of parameter values, and in the process of performing signal amplification processing based on each group of parameter values, separately obtaining instant power amplification efficiencies corresponding to the sampled input signals.

During implementation, for any group of parameter values in the multiple groups of parameter values obtained, the transmitter may obtain an instant power amplification efficiency corresponding to an input signal of the multiple sampled input signals, or may separately obtain a power amplification efficiency corresponding to each of the multiple sampled input signals. Refer to the related content for a related processing process, and details are not described herein again.

Optionally, for the case of manner 2, a processing manner of step 3 may include the following content: separately performing signal amplification processing based on each determined group of parameter values, and in the process of performing signal amplification processing based on each group of parameter values, separately obtaining an average power amplification efficiency in a time period used in the signal amplification processing process.

During implementation, for any group of parameter values in the multiple groups of parameter values obtained, after the signal amplification processing is performed, an average power amplification efficiency, corresponding to the group of parameter values, in a time period used in the signal amplification processing process may be obtained. Refer to the related content for a related processing process, and details are not described herein again. It should be noted that, when the average power amplification efficiency is calculated, an average output power of the output signal is measured when the average output power becomes stable, and the average output power corresponding to each group of parameter values is the same. If an average output power corresponding to a group of parameter values is different from average output powers corresponding to other groups of parameter values, the signal amplification processing process is performed again by using the group of parameter values, to obtain an average output power. The judgment process is continued until the average output power corresponding to the group of parameter values is the same as the average output powers corresponding to the other groups of parameter values.

As can be seen, for in the case of the average power amplification efficiency, the average output power and the output signal corresponding to each group of parameter values need to be kept stable, and the average output power corresponding to each group of parameter values needs to be kept the same. Under laboratory conditions, the requirements may be met. However, in some applications, the input signals and/or the output signals may be service signals, and it is hard to meet the requirements. However, in the case of the instant power amplification efficiency, because the output powers and the power amplification currents are measured in real time, the requirements may be relaxed. Moreover, a signal convergence speed is also faster.

Step 102: The transmitter obtains a group of parameter values corresponding to a maximum power amplification efficiency in the power amplification efficiency corresponding to each group of parameter values.

During implementation, the transmitter may obtain the power amplification efficiency corresponding to each group of parameter values through calculation in the foregoing manner. The transmitter may compare the power amplification efficiencies to find a maximum power amplification efficiency, and then determine a group of parameter values corresponding to the maximum power amplification efficiency.

In the case of manner 1, for example, signal groups after the adjustment may be (x0, y0+d), (x1, y1), and (x2, y2). A group of parameter values is calculated by using the differential mode function. The transmitter may set the group of parameter values in the signal decomposer, and then signal amplification processing is performed on the input signals, to obtain a power amplification efficiency P1 when the input signal is x0. In the case of a specified group of initial parameter values, the power amplification efficiency is P0 when the input signal is x0. If P1 is greater than P0, the transmitter continues to adjust the decomposition signals, for example, (x0, y0+2d), (x1, y1), and (x2, y2), in the signal groups according to the pattern search algorithm, and continues to execute the process, to obtain a power amplification efficiency P2 when the input signal is x0. If P1 is greater than P2, the transmitter may determine that the maximum power amplification efficiency is P1 when the input signal is x0, and the corresponding signal group is (x0, y0+d). The transmitter may continue to determine a maximum power amplification efficiency when the input signal is x1 or x2 in the same processing manner, and separately determine signal groups corresponding to x1 and x2, for example, (x1, y1+2d) and (x2, y2−d). The transmitter may calculate a group of parameter values by using the signal groups (x0, y0+d), (x1, y1+2d), and (x2, y2−d) and the differential mode function.

In the case of manner 2, the transmitter may search for an average power amplification efficiency corresponding to each group of parameter values to obtain a maximum value of the average power amplification efficiency, and may obtain a group of parameter values corresponding to the maximum value.

Step 103: The transmitter sets the group of parameter values corresponding to the maximum power amplification efficiency as parameter values of the signal decomposition parameter group.

During implementation, after obtaining a group of parameter values corresponding to the maximum power amplification efficiency, the transmitter may set the parameter values into the signal decomposer. Further, the transmitter may perform signal amplification processing by using the group of parameter values. Then, the transmitter may continue to perform, based on the currently used group of parameter values, the processing process of step 101 to step 103 on the input signal.

In this embodiment of the present disclosure, multiple groups of parameter values are set for a signal decomposition parameter group, signal amplification processing is performed based on each group of parameter values, and a power amplification efficiency corresponding to each group of parameter values is obtained. A group of parameter values corresponding to a maximum power amplification efficiency in the power amplification efficiency corresponding to each group of parameter values is obtained, and the group of parameter values corresponding to the maximum power amplification efficiency is set as parameter values of the signal decomposition parameter group. In the multiple groups of parameter values, the group of parameter values corresponding to the maximum power amplification efficiency is set as parameter values of the signal decomposition parameter group, so that a power amplification efficiency of a transmitter of a base station in the communications system is maintained at a maximum value. Even if the power amplifier of the base station is affected by an external environment, the power amplification efficiency of the transmitter may be adjusted to an optimal state in the foregoing manner, so as to improve the power amplification efficiency.

Embodiment 3

Figure 4:
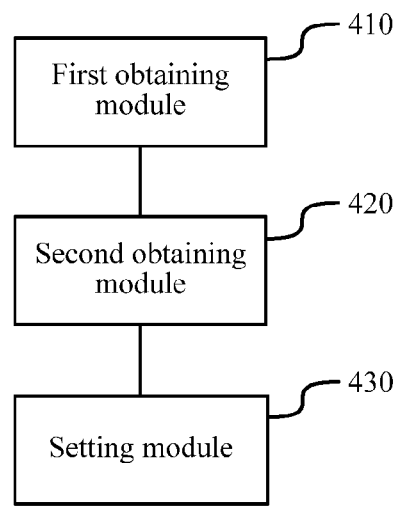
FIG. 4 is a schematic structural diagram of a signal amplification processing apparatus according to an embodiment of the present disclosure.

Based on the same technical idea, this embodiment of the present disclosure further provides a signal amplification processing apparatus. The apparatus may be applied to various types of communications systems using a networking manner of heterogeneous networks, for example, a Wideband Code Division Multiple Access system, a Time Division-Synchronous Code Division Multiple Access system, a Long Term Evolution system, and an LTE-Advanced communications system. The apparatus may be used as a transmitter or the like having a signal emission function in a base station in the communications systems. The apparatus may also be used as any apparatus that needs to implement functions of signal amplification and signal emission. As shown in FIG. 4, the apparatus includes a first obtaining module 410 configured to set multiple groups of parameter values for a signal decomposition parameter group, separately perform signal amplification processing based on each group of parameter values, and obtain a power amplification efficiency corresponding to each group of parameter values; a second obtaining module 420 configured to obtain a group of parameter values corresponding to a maximum power amplification efficiency in the power amplification efficiency corresponding to each group of parameter values; and a setting module 430 configured to set the group of parameter values corresponding to the maximum power amplification efficiency as parameter values of the signal decomposition parameter group.

Optionally, the first obtaining module 410 is further configured to: perform signal amplification processing based on a group of initial parameter values specified for the signal decomposition parameter group, sample multiple input signals having different powers, obtain decomposition signals corresponding to each of the input signals, obtain multiple signal groups including the input signals and corresponding decomposition signals, and obtain a power amplification efficiency corresponding to the group of initial parameter values; adjust, according to a pattern search algorithm, decomposition signals in at least one of the obtained multiple signal groups, and for each adjustment, determine a group of parameter values of the signal decomposition parameter group according to multiple signal groups after the adjustment; and separately perform signal amplification processing based on each determined group of parameter values, and obtain a power amplification efficiency corresponding to each group of parameter values.

Optionally, the first obtaining module 410 is configured to: in the process of performing signal amplification processing based on a group of initial parameter values specified for the signal decomposition parameter group, obtain instant power amplification efficiencies corresponding to the sampled input signals; and the first obtaining module 410 is configured to: separately perform signal amplification processing based on each determined group of parameter values, and in the process of performing signal amplification processing based on each group of parameter values, separately obtain instant power amplification efficiencies corresponding to the sampled input signals.

Optionally, the first obtaining module 410 is configured to: in the process of performing signal amplification processing based on a group of initial parameter values specified for the signal decomposition parameter group, obtain an average power amplification efficiency in a time period used in the signal amplification processing process; and the first obtaining module 410 is configured to: separately perform signal amplification processing based on each determined group of parameter values, and in the process of performing signal amplification processing based on each group of parameter values, separately obtain an average power amplification efficiency in a time period used in the signal amplification processing process.

Optionally, the first obtaining module 410 is configured to: obtain a power amplification current and an output power of the signal amplification processing that is performed based on each group of parameter values, and determine a corresponding power amplification efficiency according to the power amplification current, the output power, and a preset power amplification voltage.

In this embodiment of the present disclosure, multiple groups of parameter values are set for a signal decomposition parameter group, signal amplification processing is separately performed based on each group of parameter values, and a power amplification efficiency corresponding to each group of parameter values is obtained. A group of parameter values corresponding to a maximum power amplification efficiency in the power amplification efficiency corresponding to each group of parameter values is obtained, and the group of parameter values corresponding to the maximum power amplification efficiency is set as parameter values of the signal decomposition parameter group. In the multiple groups of parameter values, the group of parameter values corresponding to the maximum power amplification efficiency is set as parameter values of the signal decomposition parameter group, so that a power amplification efficiency of a transmitter of a base station in a communications system is maintained at a maximum value. Even if a power amplifier of the base station is affected by an external environment, the power amplification efficiency of the transmitter may be adjusted to an optimal state in the foregoing manner, so as to improve the power amplification efficiency.

It should be noted that, when the signal amplification processing apparatus provided in this embodiment performs signal amplification processing, division of the functional modules is merely used as an example for description. In practical application, the functions may be allocated to and implemented by different functional modules according to needs. That is, an internal structure of the transmitter is divided into different functional modules to implement all of or some of functions described above. In addition, the signal amplification processing apparatus in this embodiment belongs to a same concept as the embodiment of the signal amplification processing method. Refer to the method embodiment for a specific implementation process, and details are not described herein again.

Embodiment 4

Figure 5:
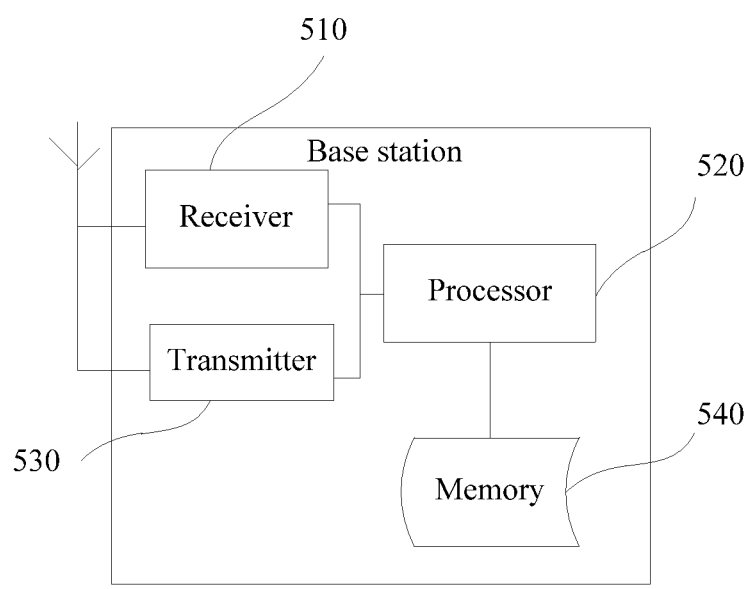
FIG. 5 is a schematic structural diagram of a base station according to an embodiment of the present disclosure.

Referring to FIG. 5, FIG. 5 is a schematic structural diagram of a base station according to this embodiment of the present disclosure. The base station may be used to implement the signal amplification processing method in the foregoing embodiment. The base station may be a base station in various types of communications systems using a networking manner of heterogeneous networks. The various types of communications system may be a Wideband Code Division Multiple Access system, a Time Division-Synchronous Code Division Multiple Access system, a Long Term Evolution system, an LTE-Advanced communications system, and the like. The base station includes a receiver 510, a processor 520, a transmitter 530, and a memory 540, where the receiver 510, the transmitter 530, and the memory 540 are separately connected to the processor 520; the processor 520 is configured to set multiple groups of parameter values for a signal decomposition parameter group, separately perform signal amplification processing based on each group of parameter values, and obtain a power amplification efficiency corresponding to each group of parameter values; the processor 520 is further configured to obtain a group of parameter values corresponding to a maximum power amplification efficiency in the power amplification efficiency corresponding to each group of parameter values, and store the group of parameter values in the memory 540; and the processor 520 is further configured to set the group of parameter values corresponding to the maximum power amplification efficiency as parameter values of the signal decomposition parameter group.

Optionally, the processor 520 is configured to: perform signal amplification processing based on a group of initial parameter values specified for the signal decomposition parameter group, sample multiple input signals having different powers, obtain decomposition signals corresponding to each of the input signals, obtain multiple signal groups including the input signals and corresponding decomposition signals, and obtain a power amplification efficiency corresponding to the group of initial parameter values; adjust, according to a pattern search algorithm, decomposition signals in at least one of the obtained multiple signal groups, and for each adjustment, determine a group of parameter values of the signal decomposition parameter group according to multiple signal groups after the adjustment; and separately perform signal amplification processing based on each determined group of parameter values, and obtain a power amplification efficiency corresponding to each group of parameter values.

Optionally, the processor 520 is configured to: in the process of performing signal amplification processing based on a group of initial parameter values specified for the signal decomposition parameter group, obtain instant power amplification efficiencies corresponding to the sampled input signals; and separately perform signal amplification processing based on each determined group of parameter values, and in the process of performing signal amplification processing based on each group of parameter values, separately obtain instant power amplification efficiencies corresponding to the sampled input signals.

Optionally, the processor 520 is configured to: in the process of performing signal amplification processing based on a group of initial parameter values specified for the signal decomposition parameter group, obtain an average power amplification efficiency in a time period used in the signal amplification processing process; and separately perform signal amplification processing based on each determined group of parameter values, and in the process of performing signal amplification processing based on each group of parameter values, separately obtain an average power amplification efficiency in a time period used in the signal amplification processing process.

Optionally, the processor 520 is configured to: obtain a power amplification current and an output power of the signal amplification processing that is performed based on each group of parameter values, and determine a corresponding power amplification efficiency according to the power amplification current, the output power, and a preset power amplification voltage.

In this embodiment of the present disclosure, multiple groups of parameter values are set for a signal decomposition parameter group, signal amplification processing is separately performed based on each group of parameter values, and a power amplification efficiency corresponding to each group of parameter values is obtained. A group of parameter values corresponding to a maximum power amplification efficiency in the power amplification efficiency corresponding to each group of parameter values is obtained, and the group of parameter values corresponding to the maximum power amplification efficiency is set as parameter values of the signal decomposition parameter group. In the multiple groups of parameter values, the group of parameter values corresponding to the maximum power amplification efficiency is set as parameter values of the signal decomposition parameter group, so that a power amplification efficiency of a transmitter of a base station in a communications system is maintained at a maximum value. Even if a power amplifier of the base station is affected by an external environment, the power amplification efficiency of the transmitter may be adjusted to an optimal state in the foregoing manner, so as to improve the power amplification efficiency.

A person of ordinary skill in the art may understand that all or some of the steps of the embodiments may be implemented by hardware or a program instructing related hardware. The program may be stored in a computer-readable storage medium. The storage medium may include a read-only memory, a magnetic disk, or an optical disc.

The foregoing descriptions are merely example embodiments of the present disclosure, but are not intended to limit the present disclosure. Any modification, equivalent replacement, and improvement made without departing from the spirit and principle of the present disclosure shall fall within the protection scope of the present disclosure.

What is claimed is:

1. An apparatus, comprising:
 a first obtainer configured to:
  set multiple groups of parameter values for a signal decomposition parameter group;
  perform, separately, signal amplification processing based on each group of parameter values; and
  obtain a power amplification efficiency corresponding to each group of parameter values;
 a second obtainer configured to obtain a group of parameter values corresponding to a maximum power amplification efficiency in the power amplification efficiency corresponding to each group of parameter values; and
 a setter configured to set the group of parameter values corresponding to the maximum power amplification efficiency as parameter values of the signal decomposition parameter group.

2. The apparatus of claim 1, wherein the first obtainer is further configured to:
 perform signal amplification processing based on a group of initial parameter values specified for the signal decomposition parameter group;
 sample multiple input signals having different powers;
 obtain decomposition signals corresponding to each of the input signals;
 obtain multiple signal groups comprising the input signals and corresponding decomposition signals;
 obtain a power amplification efficiency corresponding to the group of initial parameter values;
 adjust, based, at least in part, on a pattern search algorithm, decomposition signals in at least one of the obtained multiple signal groups;
 determine, for each adjustment, a group of parameter values of the signal decomposition parameter group based, at least in part, on multiple signal groups after the adjustment;
 perform, separately, signal amplification processing based on each determined group of parameter values; and
 obtain a power amplification efficiency corresponding to each group of parameter values.

3. The apparatus of claim 2, wherein the first obtainer is further configured to:
 obtain instant power amplification efficiencies corresponding to the sampled input signals in the process of performing signal amplification processing based on a group of initial parameter values specified for the signal decomposition parameter group;
 perform, separately, signal amplification processing based on each determined group of parameter values; and
 obtain, separately, instant power amplification efficiencies corresponding to the sampled input signals in the process of performing signal amplification processing based on each group of parameter values.

4. The apparatus of claim 2, wherein the first obtainer is further configured to:
 obtain an average power amplification efficiency in a time period used in the signal amplification processing process in the process of performing signal amplification processing based on a group of initial parameter values specified for the signal decomposition parameter group;
 perform, separately, signal amplification processing based on each determined group of parameter values; and
 obtain, separately, an average power amplification efficiency in a time period used in the signal amplification processing process in the process of performing signal amplification processing based on each group of parameter values.

5. The apparatus of claim 1, wherein the first obtainer is further configured to:
 obtain a power amplification current and an output power of the signal amplification processing that is performed based on each group of parameter values; and
 determine a corresponding power amplification efficiency based, at least in part, on the power amplification current, the output power, and a preset power amplification voltage.

6. The apparatus of claim 1, wherein the apparatus is a transmitter in a base station.

7. A signal amplification processing method comprising:
 setting multiple groups of parameter values for a signal decomposition parameter group;
 performing, separately, signal amplification processing based on each group of parameter values;
 obtaining a power amplification efficiency corresponding to each group of parameter values;
 obtaining a group of parameter values corresponding to a maximum power amplification efficiency in the power amplification efficiency corresponding to each group of parameter values; and setting the group of parameter values corresponding to the maximum power amplification efficiency as parameter values of the signal decomposition parameter group.

8. The method of claim 7, wherein setting multiple groups of parameter values for the signal decomposition parameter group comprises:
performing signal amplification processing based on a group of initial parameter values specified for the signal decomposition parameter group;
sampling multiple input signals having different powers;
obtaining decomposition signals corresponding to each of the input signals;
obtaining multiple signal groups comprising the input signals and corresponding decomposition signals; and
obtaining a power amplification efficiency corresponding to the group of initial parameter values;
adjusting, based, at least in part, on a pattern search algorithm, decomposition signals in at least one of the obtained multiple signal groups;
determining, for each adjustment, a group of parameter values of the signal decomposition parameter group based, at least in part, on multiple signal groups after the adjustment;
performing, separately, signal amplification processing based on each determined group of parameter values; and
obtaining a power amplification efficiency corresponding to each group of parameter values.

9. The method of claim 8, wherein obtaining the power amplification efficiency corresponding to the group of initial parameter values comprises obtaining instant power amplification efficiencies corresponding to the sampled input signals in the process of performing signal amplification processing based on a group of initial parameter values specified for the signal decomposition parameter group, and wherein performing, separately, signal amplification processing based on each determined group of parameter values comprises:
performing, separately, signal amplification processing based on each determined group of parameter values; and
obtaining, separately, instant power amplification efficiencies corresponding to the sampled input signals in the process of performing signal amplification processing based on each group of parameter values.

10. The method of claim 8, wherein obtaining a power amplification efficiency corresponding to the group of initial parameter values comprises obtaining an average power amplification efficiency in a time period used in the signal amplification processing process in the process of performing signal amplification processing based on a group of initial parameter values specified for the signal decomposition parameter group, and wherein performing, separately, signal amplification processing based on each determined group of parameter values comprises:
performing, separately, signal amplification processing based on each determined group of parameter values; and
obtaining, separately, an average power amplification efficiency in a time period used in the signal amplification processing process in the process of performing signal amplification processing based on each group of parameter values.

11. The method of claim 7, wherein obtaining the power amplification efficiency corresponding to each group of parameter values comprises:
obtaining a power amplification current and an output power of the signal amplification processing that is performed based on each group of parameter values; and
determining a corresponding power amplification efficiency based, at least in part, on the power amplification current, the output power, and a preset power amplification voltage.

12. A base station comprising:
a memory; and
a processor coupled to the memory, wherein the processor is configured to:
set multiple groups of parameter values for a signal decomposition parameter group;
perform, separately, signal amplification processing based on each group of parameter values;
obtain a power amplification efficiency corresponding to each group of parameter values;
obtain a group of parameter values corresponding to a maximum power amplification efficiency in the power amplification efficiency corresponding to each group of parameter values;
store the group of parameter values in the memory; and
set the group of parameter values corresponding to the maximum power amplification efficiency as the signal decomposition parameter group.

13. The base station of claim 12, wherein the processor is further configured to:
perform signal amplification processing based on a group of initial parameter values specified for the signal decomposition parameter group;
sample multiple input signals having different powers;
obtain decomposition signals corresponding to each of the input signals;
obtain multiple signal groups comprising the input signals and corresponding decomposition signals;
obtain a power amplification efficiency corresponding to the group of initial parameter values;
adjust, based, at least in part, on a pattern search algorithm, decomposition signals in at least one of the obtained multiple signal groups;
determine, for each adjustment, a group of parameter values of the signal decomposition parameter group based, at least in part, on multiple signal groups after the adjustment;
perform, separately, signal amplification processing based on each determined group of parameter values; and
obtain a power amplification efficiency corresponding to each group of parameter values.

14. The base station of claim 13, wherein the processor is further configured to:
obtain instant power amplification efficiencies corresponding to the sampled input signals in the process of performing signal amplification processing based on a group of initial parameter values specified for the signal decomposition parameter group;
perform, separately, signal amplification processing based on each determined group of parameter values; and
obtain, separately, instant power amplification efficiencies corresponding to the sampled input signals in the process of performing signal amplification processing based on each group of parameter values.

15. The base station of claim 13, wherein the processor is further configured to:
obtain an average power amplification efficiency in a time period used in the signal amplification processing process in the process of performing signal amplification processing based on a group of initial parameter values specified for the signal decomposition parameter group;

perform, separately, signal amplification processing based on each determined group of parameter values; and obtain, separately, an average power amplification efficiency in a time period used in the signal amplification processing process in the process of performing signal amplification processing based on each group of parameter values.

16. The base station of claim 12, wherein the processor is further configured to:

obtain a power amplification current and an output power of the signal amplification processing that is performed based on each group of parameter values; and determine a corresponding power amplification efficiency based, at least in part, on the power amplification current, the output power, and a preset power amplification voltage.

* * * * *